United States Patent
Ohtani et al.

(10) Patent No.: US 7,972,704 B2
(45) Date of Patent: Jul. 5, 2011

(54) SINGLE-CRYSTAL SILICON CARBIDE INGOT, AND SUBSTRATE AND EPITAXIAL WAFER OBTAINED THEREFROM

(75) Inventors: Noboru Ohtani, Sanda (JP); Masakazu Katsuno, Tokyo (JP); Hiroshi Tsuge, Tokyo (JP); Masashi Nakabayashi, Tokyo (JP); Tatsuo Fujimoto, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 12/735,405

(22) PCT Filed: Jan. 14, 2009

(86) PCT No.: PCT/JP2009/050786
§ 371 (c)(1),
(2), (4) Date: Jul. 13, 2010

(87) PCT Pub. No.: WO2009/091067
PCT Pub. Date: Jul. 23, 2009

(65) Prior Publication Data
US 2010/0289033 A1    Nov. 18, 2010

(30) Foreign Application Priority Data
Jan. 15, 2008 (JP) .................................. 2008-005950

(51) Int. Cl.
*B32B 9/04* (2006.01)

(52) U.S. Cl. .................. 428/446; 428/698; 117/951
(58) Field of Classification Search .................. None
See application file for complete search history.

(56) References Cited

FOREIGN PATENT DOCUMENTS

| | | |
|---|---|---|
| JP | 09-157092 | 6/1997 |
| JP | 10-182296 | 7/1998 |
| JP | 2000-503968 | 4/2000 |
| JP | 2007-320790 | 12/2007 |
| WO | WO 97/28297 | 8/1997 |

OTHER PUBLICATIONS

International Search Report dated Apr. 28, 2009 issued in corresponding PCT Application No. PCT/JP2009/050786.
Yu. M. Tairov and V. F. Tsvetkov, "General Principles of Gowing Large-Size Single Crystals of Various Silicon Carbide Polytypes" Journal of Crystal Growth, vol. 52 (1981) pp. 146-150.

*Primary Examiner* — Timothy M Speer
(74) *Attorney, Agent, or Firm* — Kenyon & Kenyon LLP

(57) ABSTRACT

The present invention provides a single-crystal silicon carbide ingot capable of providing a good-quality substrate low in dislocation defects, and a substrate and epitaxial wafer obtained therefrom.
It is a single-crystal silicon carbide ingot comprising single-crystal silicon carbide which contains donor-type impurity at a concentration of $2\times10^{18}$ $cm^{-3}$ to $6\times10^{20}$ $cm^{-3}$ and acceptor-type impurity at a concentration of $1\times10^{18}$ $cm^{-3}$ to $5.99\times10^{20}$ $cm^{-3}$ and wherein the concentration of the donor-type impurity is greater than the concentration of the acceptor-type impurity and the difference is $1\times10^{18}$ $cm^{-3}$ to $5.99\times10^{20}$ $cm^{-3}$, and a substrate and epitaxial wafer obtained therefrom.

11 Claims, 1 Drawing Sheet

SINGLE-CRYSTAL SILICON CARBIDE INGOT, AND SUBSTRATE AND EPITAXIAL WAFER OBTAINED THEREFROM

This application is a national stage application of International Application No. PCT/JP2009/050786, filed 14 Jan. 2009, which claims priority to Japanese Application No. 2008-005950, filed 15 Jan. 2008, which is incorporated by reference in its entirety.

TECHNICAL FIELD

This invention relates to a single-crystal silicon carbide ingot, and a substrate and epitaxial wafer obtained therefrom, particularly to a large single-crystal ingot, and a substrate and epitaxial wafer obtained therefrom, that are of good quality suitable for a substrate wafer of an electronic device.

BACKGROUND ART

Owing to its outstanding physical and chemical properties, including excellent heat resistance, mechanical strength and resistance to radiation, silicon carbide (SiC) has attracted attention as an environmentally rugged semiconductor material. Moreover, recent years have seen increasing demand for SiC single-crystal substrates for use as substrate wafers in short wavelength optical devices in the blue-to-UV spectral region, high-frequency electronic devices, high-breakdown voltage electronic devices and the like. However, no crystal growth technology enabling reliable industrial-scale supply of large-area single-crystal SiC of high-quality has yet been established. Practical utilization of SiC has therefore been thwarted despite these many merits and its high potential.

Single-crystal SiC of a size usable for fabrication of semiconductor devices has up to now been conducted on a laboratory scale using, for example, the sublimation recrystallization process (Lely process). However, the single crystal obtained by this method is of small area, and its dimensions and shape are difficult to control. Moreover, control of the crystal polytype and doping carrier concentration of the SiC is not easy either. On the other hand, cubic single-crystal SiC is being produced by heteroepitaxial growth, i.e., growth on a substrate of a different type like silicon (Si), using chemical vapor deposition (CVD). Although large-area single crystal can be obtained by this process, high-quality single-crystal SiC is hard to produce because the approximately 20% lattice-mismatch between the SiC and the substrate causes ready occurrence of stacking faults and crystal defects.

The modified Lely process, which conducts sublimation recrystallization using a single-crystal SiC substrate as a seed, was developed to overcome these problems (Yu. M. Tairov and V. F. Tsvetkov, Journal of Crystal Growth, vol. 52 (1981) pp. 146-150). The modified Lely process is in use at many research institutions. Owing to its use of a seed crystal, the process can control the crystal nucleation process and, by controlling the ambient inert gas pressure to around 100 Pa to 15 kPa, can control crystal growth rate and the like with good reproducibility.

The principle of the modified Lely process will be explained with reference to FIG. 1. The single-crystal SiC used as the seed crystal and the single-crystal SiC powder used as the feedstock are placed in a crucible (usually made of graphite) and heated to 2000 to 2400° C. in an argon or other inert gas atmosphere (133 to 13.3 kPa). A temperature gradient is established during the heating so as to make the temperature of the seed crystal slightly lower than the temperature of the feedstock powder. Owing to its concentration gradient (produced by the temperature gradient), the sublimated feedstock is dispersed toward and transported to the seed crystal. Single crystal growth occurs when the feedstock gas reaching the seed crystal recrystallizes on the seed crystal. The resistivity of the crystal can be controlled during the growth by adding a doping gas to the inert gas atmosphere or by mixing a doping element or a compound thereof into the SiC feedstock powder. Typical substitutional impurities used to dope single-crystal SiC include nitrogen (n type), boron (p type) and aluminum (p type). The modified Lely process makes it possible to grow single-crystal SiC while controlling its polytype (6H, 4H, 15R and other polytypes), shape, and carrier type and concentration.

Currently, 2-inch (50.8 mm) to 3-inch (76.2 mm) single-crystal SiC substrates are being produced by the modified Lely process and used for epitaxial film growth and device fabrication. However, fabrication of high-performance devices has been hindered by the presence in the single-crystal SiC substrates of dislocations (line-like crystal defects) at the rate of several tens of thousands to several millions per square cm. Reduction of basal plane dislocations present on the (0001) basal plane is particularly desirable because they are known to degrade the reliability of SiC devices.

It has been reported that basal plane dislocations occur and proliferate as the result of thermal stress sustained by the crystal during growth. During crystal growth, thermal stress acting on the basal plane dislocations introduced into the single-crystal SiC causes them to slip, and the slipping promotes occurrence of Frank-Read type dislocations. The proliferation of these basal plane dislocations greatly increases the basal plane dislocation density in the single-crystal SiC. The etch pit density attributable to basal plane dislocations measured on the single-crystal SiC substrate at an off-angle of 8° from the (0001) Si plane is ordinarily well over $1 \times 10^4$ $cm^{-2}$.

SUMMARY OF THE INVENTION

As set out in the foregoing, the basal plane dislocations occurring in the single-crystal SiC slip owing to the thermal stress acting on them during growth of the single crystal, and this slipping increases the density of the basal plane dislocations. Reduction of the thermal stress acting on the crystal during growth is therefore necessary for reducing occurrence of basal plane dislocations in the single-crystal SiC. Although various innovations and improvements have been focused on minimizing thermal stress, the degree of minimization possible is limited in a system that utilizes a heat gradient to drive crystal growth.

The present invention was made in light of these circumstances and is aimed at providing a single-crystal silicon carbide ingot capable of providing a good-quality substrate low in basal plane dislocations, and a substrate and epitaxial wafer obtained therefrom.

The present invention provides:

(1) A single-crystal SiC ingot comprising single-crystal silicon carbide (SiC) which contains donor-type impurity at a concentration of $2 \times 10^{18}$ $cm^{-3}$ to $6 \times 10^{20}$ $cm^{-3}$ and acceptor-type impurity at a concentration of $1 \times 10^{18}$ $cm^{-3}$ to $5.99 \times 10^{20}$ $cm^{-3}$ and wherein the concentration of the donor-type impurity is greater than the concentration of the acceptor-type impurity and the difference is $1 \times 10^{18}$ $cm^{-3}$ to $5.99 \times 10^{20}$ $cm^{-3}$.

(2) A single-crystal SiC ingot according to (1), wherein the difference between the donor-type impurity concentration and the acceptor-type impurity concentration is $6\times10^{18}$ cm$^{-3}$ to $5.99\times10^{20}$ cm$^{-3}$.

(3) A single-crystal SiC ingot according to (1) or (2), wherein the crystal polytype of the single-crystal SiC is 4H.

(4) A single-crystal SiC ingot according to any of (1) to (3), wherein the donor-type impurity is nitrogen.

(5) A single-crystal SiC ingot according to any of (1) to (4), wherein the acceptor-type impurity is boron.

(6) A single-crystal SiC ingot according to any of (1) to (4), wherein the acceptor-type impurity is aluminum.

(7) A single-crystal SiC ingot according to any of (1) to (6), wherein the diameter of the ingot is 50 mm to 300 mm.

(8) A single-crystal SiC ingot according to any of (1) to (7), wherein the etch pit density caused by basal plane dislocations measured on a single-crystal SiC substrate cut from the ingot at an off-angle of 8° from the (0001) Si plane and polished is $1\times10^4$ cm$^{-2}$ or less.

(9) A single-crystal SiC ingot according to any of (1) to (7), wherein the etch pit density caused by basal plane dislocations measured on a single-crystal SiC substrate cut from the ingot at an off-angle of 8° from the (0001) Si plane and polished is $5\times10^3$ cm$^{-2}$ less.

(10) A single-crystal SiC substrate cut from a single-crystal SiC ingot according to any of (1) to (7) and polished.

(11) An SiC epitaxial wafer obtained by epitaxially growing an SiC film on the single-crystal SiC substrate of (10).

(12) An SiC epitaxial wafer obtained by epitaxially growing gallium nitride (GaN), aluminum nitride (AlN), indium nitride (InN) or a mixed crystal thereof on the single-crystal SiC substrate of (10).

BEST MODE FOR CARRYING OUT THE INVENTION

Figure 1:
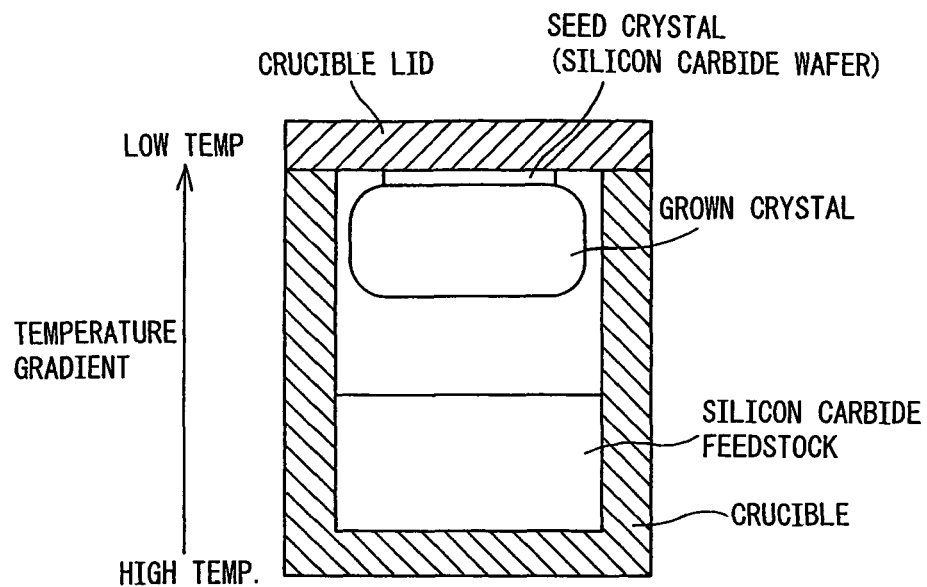
FIG. 1 is a diagram for explaining the principle of the modified Lely process.

The single-crystal SiC of the invention single-crystal SiC ingot contains donor-type impurity at a concentration of $2\times10^{18}$ cm$^{-3}$ to $6\times10^{20}$ cm$^{-3}$ and acceptor-type impurity at a concentration of $1\times10^{18}$ cm$^{-3}$ to $5.99\times10^{20}$ cm$^{-3}$, the concentration of the donor-type impurity is greater than that of the acceptor-type impurity, and the difference is $1\times10^{18}$ cm$^{-3}$ to $5.99\times10^{20}$ cm$^{-3}$. As a result, the number of dislocation defects in the single-crystal SiC can be reduced.

The method of producing the single-crystal SiC ingot of the present invention will be explained first. In the method of producing the single-crystal SiC of the present invention, an SiC bulk single-crystal ingot is produced by growing single-crystal SiC on a seed crystal composed of single-crystal SiC by a process that grows silicon carbide single crystal which contains donor-type impurity at a concentration of $2\times10^{18}$ cm$^{-3}$ to $6\times10^{20}$ cm$^{-3}$ and acceptor-type impurity at a concentration of $1\times10^{18}$ cm$^{-3}$ to $5.99\times10^{20}$ cm$^{-3}$ and wherein the concentration of the donor-type impurity is greater than that of the acceptor-type impurity and the difference is $1\times10^{18}$ cm$^{-3}$ to $5.99\times10^{20}$ cm$^{-3}$. The inventors conducted numerous crystal growth experiments through which they discovered that the basal plane dislocation density of low-resistivity single-crystal SiC is markedly reduced when crystal growth is conducted to control the donor-type impurity concentration and acceptor-type impurity concentration to these prescribed concentrations.

The mechanism by which the basal plane dislocation density can be reduced is discussed in the following.

Basal plane dislocation density becomes high during single-crystal SiC growth because, as pointed out in the foregoing, the dislocations undergo slipping that increases the occurrence of Frank-Read type dislocations. This slipping of the dislocations is driven by the thermal stress acting on the single-crystal SiC during growth. However, as mentioned above, there is a limit to how far the thermal stress can be reduced.

The inventors studied how to control dislocation slipping by a method other than thermal stress reduction. A method used to inhibit dislocation slipping in a metallic crystal is to add an impurity to the crystal that pins (immobilizes) the dislocations. The inventors therefore investigated whether nitrogen, a donor-type impurity ordinarily added to single-crystal SiC to lower resistivity, exhibited such pinning activity. However, no effect of inhibiting dislocation slipping was observed even when the amount of added nitrogen was $1\times10^{19}$ cm$^{-3}$ or greater.

Next, the inventors conducted a study on the basis of numerous experiments to determine whether any other impurity had such an effect. As a result, they learned that impurity with acceptor-type electrical property present in the single-crystal SiC exhibits such activity. It was found that particularly boron, aluminum and other acceptor-type impurities that form relatively shallow acceptor levels exhibit pronounced pinning effect. The level depth of such an acceptor-type impurity is preferably around 500 meV or less, so that gallium, beryllium and the like are also candidates in addition to boron and aluminum. When such an acceptor-type impurity is added to single-crystal SiC at a concentration of $1\times10^{18}$ cm$^{-3}$ or greater, basal plane dislocation slipping can be inhibited, thereby enabling production of crystal with a low dislocation density. However, when this much acceptor-type impurity is added, the electrical resistivity of the single-crystal SiC becomes relatively high (about 1Ω or greater), so that it is impossible to obtain single-crystal SiC of low resistivity (about 0.1Ω or less) useful for power devices and the like.

In the present invention, this problem is overcome by making the concentration of donor-type impurity added to the single-crystal SiC higher than the concentration of the acceptor-type impurity. Addition of acceptor-type impurity to a concentration of $1\times10^{18}$ cm$^{-3}$ or greater inhibits slipping of the basal plane dislocations in the single-crystal SiC and, together with the simultaneous addition of more donor-type impurity than acceptor-type impurity and so as to make the difference $1\times10^{18}$ cm$^{-3}$ to $5.99\times10^{20}$ cm$^{-3}$, enables production of a single-crystal SiC ingot that is low in resistivity (0.1Ω or less) and also low in basal plane dislocation density. Nitrogen is the preferred donor-type impurity because of its good activation, ease of handling and simplicity of addition method, but donor-type impurities other than nitrogen, such as phosphorous and arsenic, are also usable.

The single-crystal SiC ingot having the aforesaid donor-type impurity concentration and acceptor-type impurity concentration can be realized using various impurity addition methods. For example, the impurity can be added as a gas supplied during crystal growth or can be added as a solid (elemental or compound powder) mixed with the SiC powder material beforehand. In these cases, the desired impurity concentration can be achieved by regulating the impurity gas flow rate or the added amount of impurity solid (powder).

The acceptor-type impurity concentration is specified as $1\times10^{18}$ cm$^{-3}$ to $5.99\times10^{20}$ cm$^{-3}$. When the acceptor-type impurity concentration is less than $1\times10^{18}$ cm$^{-3}$, the impurity exhibits no dislocation pinning effect. When it exceeds $5.99\times10^{20}$ cm$^{-3}$, low-resistivity single-crystal SiC cannot be obtained.

The donor-type impurity concentration is specified as $2\times10^{18}$ cm$^{-3}$ to $6\times10^{20}$ cm$^{-3}$. When the donor-type impurity concentration is less than $2\times10^{18}$ cm$^{-3}$, low-resistivity single-crystal SiC cannot be obtained. When it exceeds $6\times10^{20}$ cm$^{-3}$, the crystallinity of the single-crystal SiC is degraded because the donor-type impurity exceeds its solid-solubility limit.

The concentration difference between the donor-type impurity and the acceptor-type impurity is specified as $1\times10^{18}$ cm$^{-3}$ to $5.99\times10^{20}$ cm$^{-3}$ and preferably as $6\times10^{18}$ cm$^{-3}$ to $5.99\times10^{20}$ cm$^{-3}$. When the concentration difference between the donor-type impurity and the acceptor-type impurity is less than $1\times10^{18}$ cm$^{-3}$, low-resistivity single-crystal SiC cannot be obtained. When it exceeds $5.99\times10^{20}$ cm$^{-3}$, the dislocation pinning effect is inadequate and crystallinity degradation occurs. When the concentration difference between the donor-type impurity and the acceptor-type impurity is made $6\times10^{18}$ cm$^{-3}$ or greater, the resistivity of the single-crystal SiC becomes $0.04\Omega$ or less, which is ideal for an SiC power device whose substrate conducts electricity The polytype of the single-crystal SiC can be cubic (3C), hexagonal (6H or 4H), or rhombohedral (15R), for example. Among these, the hexagonal 6H- and 4H-polytype crystals are the best for power device applications owing to the size of their forbidden band widths, among other properties, and they have been used to produce many devices up to now. However, it was recently found that the electron mobility of 4H-polytype single-crystal SiC is more than two fold that of 6H-polytype, and this plus the fact that the anisotropy of its electrical conductivity is smaller, has led to almost all SiC power devices being produced using 4H-polytype single-crystal SiC substrates nowadays.

As the single-crystal SiC ingot of the present invention has a diameter of 50 mm to 300 mm, production of various devices using substrates obtained from the ingot can be carried out using a production line already industrially established for conventional semiconductor (e.g., Si, GaAs) substrates, and as such, is suitable for mass production.

Moreover, the basal plane dislocation density of a substrate cut from such a single-crystal SiC ingot and polished, as evaluated in terms of the etch pit density measured for a substrate with an off-angle of 8° from the (0001) Si plane, was $1\times10^{4}$ cm$^{-2}$ or less, which is a low value that makes it possible to enhance the reliability of a device fabricated on the substrate.

The reason for evaluating the basal plane dislocation density in terms of the etch pit density of an off-angle substrate is that basal plane dislocation density is hard to evaluate using a substrate with no off-angle because the basal plane dislocations and the substrate surface do not intersect. The reason for defining the off-angle as 8° from the (0001) Si plane is that a substrate with an 8° off-angle in the [11-20] direction is generally used in the SiC homoepitaxial growth step that is the next process in substrate production.

In SiC homoepitaxial growth, the substrate is imparted with an off-angle of 8° because stable step-flow growth that inherits the polytype of the underlying substrate can be achieved on an off-angle substrate. But the off-angle of the substrate is not limited to 8° and good-quality SiC homoepitaxial growth can be achieved insofar as the off-angle is in the approximate range of 1° to 12°.

The basal plane dislocation reduction effect of the present invention, namely that of the density of the etch pits corresponding to the basal plane dislocations being lowered to $1\times10^{4}$ cm$^{-2}$ or less, is more strongly manifested in large-diameter crystal, e.g., SiC single-crystal of 100 mm or greater diameter. This is because temperature distribution occurs more readily and thermal stress increases in proportion as the diameter of the produced single-crystal SiC is greater.

Since the single-crystal SiC substrate produced according to the present invention has a low basal plane dislocation density of $1\times10^{4}$ cm$^{-2}$ or less, it is less likely than conventional ones to cause device property degradation and other problems attributable to basal plane dislocations. Moreover, a single-crystal SiC epitaxial wafer fabricated by growing an epitaxial film of around 0.1 to 500 μm on this single-crystal SiC substrate by the CVD process or the like, particularly a homoepitaxial wafer formed with a film of SiC or an epitaxial wafer formed with a film of GaN, AlN, InN or a mixed crystal thereof, exhibits excellent properties (epitaxial film surface morphology, breakdown voltage, etc.) because the dislocation density of the single-crystal SiC substrate constituting the substrate wafer is small.

The surface morphology of the epitaxial wafer is an important epitaxial wafer property that directly affects the performance of the device fabricated thereon. Poor surface morphology, such as when pits or the like are present on the epitaxial film surface or the surface is not smooth, prevents fabrication of high-performance devices by degrading interface properties in the semiconductor device, specifically the metal-semiconductor interface and insulation film-semiconductor interface properties. Moreover, the surface morphology of an epitaxial film is easily affected by the dislocation density of the underlying substrate, so that the surface morphology of an epitaxial film on a substrate with high dislocation density tends to be inferior.

EXAMPLES

Examples of the present invention and comparative examples are set out in the following.

Example 1

Figure 2:
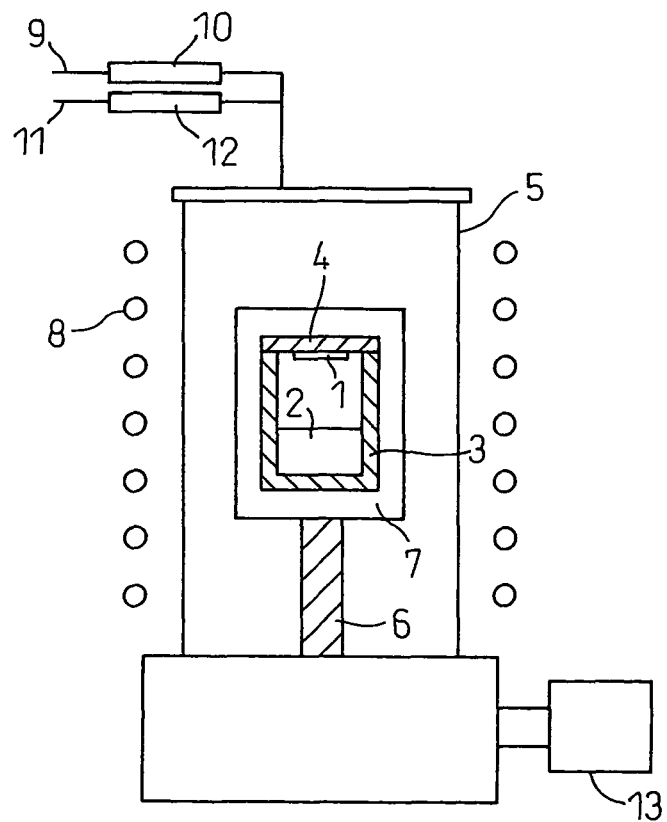
FIG. 2 is a block diagram showing an example of a single crystal growth apparatus in the method of producing a single-crystal silicon carbide ingot according to the present invention.

FIG. 2 shows an apparatus for producing the single-crystal SiC ingot of the present invention, which is an example of an apparatus for growing single-crystal SiC by the modified Lely process using a seed crystal.

This single-crystal growth apparatus will be briefly explained first. Crystal growth is performed by sublimating feedstock SiC powder 2 and recrystallizing it on single-crystal SiC 1 used as the seed crystal. The single-crystal SiC 1 constituting the seed crystal is attached to the inner surface of a graphite lid 4 of a graphite crucible 3. The feedstock SiC powder 2 is charged into the graphite crucible 3. The so-prepared graphite crucible 3 is mounted on a graphite support rod 6 inside a double-walled quartz tube 5. Graphite heat insulation 7 is installed around the graphite crucible 3 to form a heat shield. The double-wall quartz tube 5 can be evacuated to a high vacuum ($10^{-3}$ Pa or less) by a vacuum pumping system 13, and the pressure of the internal atmosphere can be controlled with a mixed gas of Ar and nitrogen. The double quartz tube can be supplied with Ar gas from an Ar gas tube 9 through an Ar gas mass flow controller 10 and with nitrogen gas from a nitrogen gas tube 11 through a nitrogen gas mass flow controller 12. A work coil 8 is installed around the double-wall quartz tube 5, and the graphite crucible 3 can be heated to heat the feedstock and seed crystal to the desired temperatures by passing high-frequency electric current through the work coil 8. Light paths measuring 2 to 4 mm in diameter are formed in the middle of the heat insulation covering the top and bottom of the crucible, light is extracted from the top and bottom of the crucible, and the crucible temperature is measured with two-color pyrometers. The temperature of the crucible bottom is treated as the feedstock temperature and the temperature of the crucible top is treated as the seed crystal temperature.

An example of producing SiC single crystal using the crystal growth apparatus will now be explained.

First, the seed crystal SiC 1 was prepared by cutting from an SiC single crystal ingot grown in advance a 50-mm diameter, 1-mm thick substrate with an off-angle of 4° from the {0001} plane. The seed crystal 1 was then attached to the inner surface of the lid 4 of the graphite crucible 3. The feedstock 2 was charged into the graphite crucible 3. As the feedstock SiC powder 2 was used one obtained by acid-washing commercially available industrial single-crystal SiC powder (containing, in mass ppm, several ppm of boron and around 10 to 20 ppm of aluminum), drying the washed powder and then mixing it with, in mass %, 0.26% of $B_4C$ powder, a solid material of the acceptor-type impurity boron.

Next, the graphite crucible 3 charged with the feedstock was closed by the lid 4 with the seed crystal attached, covered with the heat insulation 7, set on top of the graphite support rod 6, and placed inside the double-wall quartz tube 5. Once the interior of the double-wall quartz tube 5 had been vacuumized, current was passed through the work coil 8 to elevate the feedstock temperature to 2000° C. Ar gas containing 12% nitrogen, in volume by volume percent, was then passed in as atmosphere gas and the feedstock temperature was increased to the desired temperature of 2400° C. while maintaining the internal pressure of the quartz tube at about 80 kPa. The pressure was reduced to the growth pressure of 1.3 kPa over about 30 min and growth was then continued for about 50 h. The temperature gradient in the crucible at this time was 15° C./cm and the crystal growth velocity was about 0.62 mm/h on average. The crystal finally obtained measured 51.5 mm in diameter and about 31 mm in height.

Analysis of the obtained SiC single crystal by X-ray diffraction and Raman scattering confirmed growth of a 4H SiC single crystal ingot. Investigation of the nitrogen concentration and boron concentration of the grown single crystal by secondary ion mass spectrometry gave the values of $1.2 \times 10^{19}$ $cm^{-3}$ and $4.1 \times 10^{18}$ $cm^{-3}$, respectively. The resistivity of the grown crystal was measured by the eddy current method. The value obtained was 0.022 Ωcm.

Next, for the purpose of evaluating the basal plane dislocation density present in the grown crystal, a substrate was cut from the grown single crystal ingot at an off-angle of 8° from the (0001) Si plane and polished. The substrate surface was then etched with molten KOH at about 530° C., and the density of the etch pits corresponding to basal plane dislocations were observed with a microscope. The average value obtained for the whole substrate surface was $5.6 \ 10^3 \ cm^{-2}$.

A 51 mm-diameter {0001} single-crystal SiC substrate was further cut from the aforesaid single-crystal SiC and mirror-polished. The surface orientation of the substrate was given an off-angle of 8° in the [11-20] direction from the (0001) Si plane. Epitaxial growth of SiC was performed using this single-crystal SiC substrate. The SiC epitaxial film growth conditions were: growth temperature of 1550° C. and flow rates of silane ($SiH_4$), ethylene ($C_2H_4$), nitrogen ($N_2$), and hydrogen ($H_2$) of $5.0 \times 10^{-9} \ m^3$/sec, $3.8 \times 10^{-9} \ m^3$/sec, $3.3 \times 10^{-9} \ m^3$/sec, and $1.7 \times 10^{-5} \ m^3$/sec, respectively. The growth pressure was 13 kPa. The growth time was 1.2 h, during which the film grew to a thickness of about 8 μm.

Following the epitaxial film growth, the surface morphology of the obtained epitaxial film was examined with a Nomarski light microscope. The observation showed that an SiC epitaxial film was grown which was very flat over the entire substrate surface and had excellent surface morphology with few pits or other surface defects.

Further, a single-crystal SiC substrate was similarly cut from the aforesaid single-crystal SiC to have an off-angle of 0° from the (0001) Si plane and mirror-polished, whereafter a GaN film was epitaxially grown thereon by the metal organic chemical vapor deposition (MOCVD) process under growth conditions of a growth temperature of 1050° C. and flow rates of trimethyl gallium (TMG), ammonia ($NH_3$), and silane ($SiH_4$) of $54 \times 10^{-6}$ mol/min, 4 liter/min, and $22 \times 10^{-11}$ mol/min, respectively. The growth pressure was atmospheric pressure. The growth time was 20 min and an n-type GaN film was grown to a thickness of 1 μm.

In order to check the surface condition of the obtained GaN film, the grown surface was observed with a Nomarski light microscope. It was found that a very flat morphology was obtained throughout the substrate surface and that a high-quality GaN film was formed.

Finally, the SiC homoepitaxial wafer prepared earlier was used to fabricate Schottky barrier diodes (SBDs). Titanium was used as the Schottky electrode material and nickel as the rear-side ohmic contact material. The electrodes measured 1.2 mm in diameter and the terminal structure around the Schottky electrodes was formed by implanting aluminum ions. A total of 256 SBDs were fabricated over the whole surface of the 51-mm diameter wafer and the breakdown voltage of each device was measured. Since the thickness and doping density of the SiC epitaxial film produced in this example were around 8 μm and $8 \times 10^{15} \ cm^{-3}$, the device yield was calculated based on an acceptable device being defined as one having a breakdown voltage exceeding 600 V. A device yield of 82% was obtained with the SiC homoepitaxial wafer of this example. When the property degradation caused by the device fabrication process (device degradation by dust contamination and the like) is taken into account, it can be considered that there was substantially no property degradation attributable to the quality of the epitaxial film itself. The average ON-state voltage of the SBDs was 1.55 V.

Example 2

An example of a case in which aluminum was added as the acceptor-type impurity will be set out.

First, the seed crystal 1 was prepared by cutting from an SiC single crystal ingot grown in advance a 50-mm diameter, 1-mm thick substrate with an off-angle of 4° from the {0001} plane. The seed crystal 1 was then used to conduct crystal growth for 50 h by the same procedure as in Example 1. In this example, however, $Al_4C_3$ powder, a solid material of aluminum, was placed in a capsule-like graphite container and then added to the feedstock SiC crystal powder. The mixing ratio of the $Al_4C_3$ powder with the SiC crystal powder was, in mass %, 35.7%. The obtained crystal measured 51.5 mm in diameter and grew to a height of about 30 mm at an average crystal growth velocity of about 0.60 mm/h.

Analysis of the so-obtained SiC single crystal by X-ray diffraction and Raman scattering confirmed growth of a 4H SiC single crystal ingot. Measurement of the nitrogen and aluminum concentrations of the single-crystal by secondary ion mass spectrometry gave the values of $1.1 \times 10^{19} \ cm^{-3}$ and $2.2\times10^{18}$ cm$^{-3}$, respectively. The resistivity of the grown crystal was measured by the eddy current method. The value obtained was 0.020 Ω·cm.

Next, for the purpose of evaluating the basal plane dislocation density present in the grown crystal, a substrate was cut from the grown single crystal ingot at an off-angle of 8° from the (0001) Si plane and polished. The substrate surface was then etched with molten KOH at about 530° C., and the density of the etch pits corresponding to basal plane dislocations were observed with a microscope. The average value obtained for the whole substrate surface was $7.4\times10^{3}$ cm$^{-2}$.

A 51 mm-diameter {0001} single-crystal SiC substrate was further cut from the aforesaid single-crystal SiC and polished into a mirror-finished substrate. The surface orientation of the substrate was given an off-angle of 8° in the [11-20] direction from the (0001) Si plane. Epitaxial growth of SiC was performed using this single-crystal SiC substrate. The SiC epitaxial film growth conditions were: growth temperature of 1550° C. and flow rates of SiH$_4$, C$_2$H$_4$, N$_2$, and H$_2$ of $5.0\times10^{-8}$ m$^3$/sec, $3.8\times10^{-9}$ m$^3$/sec, $3.3\times10^{-8}$ m$^3$/sec, and $1.7\times10^{-5}$ m$^3$/sec, respectively. The growth pressure was 13 kPa. The growth time was 1.2 h, during which the film grew to a thickness of about 8 μm.

Following the epitaxial film growth, the surface morphology of the obtained epitaxial film was examined with a Nomarski light microscope. The observation showed that a smooth surface with few pits or the like was obtained.

Further, a single-crystal SiC substrate was similarly cut from the aforesaid single-crystal SiC to have an off-angle of 0° from the (0001) Si plane and mirror-polished, whereafter a GaN film was epitaxially grown thereon by the MOCVD process. The growth conditions were: growth temperature of 1050° C. and flow rates of TMG, NH$_3$, and SiH$_4$ of $54\times10^{-6}$ mol/min, 4 liter/min, and $22\times10^{-11}$ mol/min, respectively. The growth pressure was atmospheric pressure. The growth time was 20 min and an n-type GaN film was grown to a thickness of about 1 μm.

In order to check the surface condition of the obtained GaN film, the grown surface was observed with a Nomarski light microscope. It was found that an epitaxial film was formed that had good surface morphology with few pits or the like.

Finally, the SiC homoepitaxial wafer prepared earlier was used to fabricate SBDs. The materials and sizes of the Schottky electrodes and ohmic contacts were all the same as in Example 1. The breakdown voltages of the 256 SBDs were measured, with an acceptable device being defined as having a device breakdown voltage exceeding 600 V. A device yield of 79% was obtained with the SiC homoepitaxial wafer of this example. The average ON-state voltage of the SBDs was 1.52 V.

Example 3

An example in which boron and nitrogen were both added in greater amounts than in Example 1 will be set out.

First, the seed crystal 1 was prepared by cutting from an SiC single crystal ingot grown in advance a 50-mm diameter, 1-mm thick substrate with an off-angle of 4° from the {0001} plane. The seed crystal 1 was then used to conduct crystal growth for 50 h by the same procedure as in Example 1. In this example, however, the mixing ratio of the B$_4$C powder was, in mass %, 2%. Moreover, crystal growth was conducted with Ar gas containing 40% nitrogen, in volume by volume percent, passed in as the atmosphere gas. The obtained crystal measured 51.5 mm in diameter and grew to a height of about 27 mm at an average crystal growth velocity of about 0.54 mm/h.

Analysis of the so-obtained SiC single crystal by X-ray diffraction and Raman scattering confirmed growth of a 4H SiC single crystal ingot. Measurement of the nitrogen and boron concentrations of the single-crystal by secondary ion mass spectrometry gave the values of $2.7\times10^{19}$ cm$^{-3}$ and $1.5\times10^{19}$ cm$^{-3}$, respectively. The resistivity of the grown crystal was measured by the eddy current method. The value obtained was 0.015 Ω·cm.

Next, for the purpose of evaluating the basal plane dislocation density present in the grown crystal, a substrate was cut from the grown single crystal ingot at an off-angle of 8° from the (0001) Si plane and polished. The substrate surface was then etched with molten KOH at about 530° C., and the density of the etch pits corresponding to basal plane dislocations were observed with a microscope. The average value obtained for the whole substrate surface was $2.3\times10^{3}$ cm$^{-2}$.

A 51 mm-diameter {0001} single-crystal SiC substrate was further cut from the aforesaid single-crystal SiC and polished into a mirror-finished substrate. The surface orientation of the substrate was given an off-angle of 8° in the [11-20] direction from the (0001) Si plane. Epitaxial growth of SiC was performed using this single-crystal SiC substrate. The SiC epitaxial film growth conditions were: growth temperature of 1550° C. and flow rates of SiH$_4$, C$_2$H$_4$, N$_2$, and H$_2$ of $5.0\times10^{-9}$ m$^3$/sec, $3.8\times10^{-9}$ m$^3$/sec, $3.3\times10^{-9}$ m$^3$/sec, and $1.7\times10^{-5}$ m$^3$/sec, respectively. The growth pressure was 13 kPa. The growth time was 1.2 h, during which the film grew to a thickness of about 8 μm.

Following the epitaxial film growth, the surface morphology of the obtained epitaxial film was examined with a Nomarski light microscope. Formation of a smooth surface throughout the substrate was confirmed.

Further, a single-crystal SiC substrate was similarly cut from the aforesaid single-crystal SiC to have an off-angle of 0° from the (0001) Si plane and mirror-polished, whereafter a GaN film was epitaxially grown thereon by the MOCVD process. The growth conditions were: growth temperature of 1050° C. and flow rates of TMG, NH$_3$, and SiH$_4$ of $54\times10^{-6}$ mol/min, 4 liter/min, and $22\times10^{-11}$ mol/min, respectively. The growth pressure was atmospheric pressure. The growth time was 20 min and an n-type GaN film was grown to a thickness of about 1 μm.

In order to check the surface condition of the obtained GaN film, the grown surface was observed with a Nomarski light microscope. It was found that an epitaxial film was formed that exhibited smooth surface morphology. Finally, the SiC homoepitaxial wafer prepared earlier was used to test-fabricate SBDs. The materials and sizes of the Schottky electrodes and ohmic contacts were all the same as in Example 1. The breakdown voltages of the 256 SBDs were measured, with an acceptable device being defined as having a device breakdown voltage exceeding 600 V. A device yield of 89% was obtained with the SiC homoepitaxial wafer of this example. The average ON-state voltage of the SBDs was 1.48 V.

Comparative Example 1

As a comparative example, there will be described a growth experiment using feedstock powder whose SiC crystal powder was deliberately not added with any B$_4$C powder whatsoever.

First, the seed crystal 1 was prepared by cutting from an SiC single crystal ingot grown in advance a 50-mm diameter, 1-mm thick substrate with an off-angle of 4° from the {0001} plane. The seed crystal 1 was then used to conduct crystal growth for 50 h by the same procedure as in the examples. In this comparative example, however, SiC crystal to which absolutely no $B_4C$ powder was added was used as the feedstock. The obtained crystal measured 51.5 mm in diameter and grew to a height of about 32 mm at an average crystal growth velocity of about 0.64 mm/h.

Analysis of the so-obtained SiC single crystal by X-ray diffraction and Raman scattering confirmed growth of a 4H SiC single crystal ingot. Measurement of the nitrogen and boron concentrations of the single-crystal by secondary ion mass spectrometry gave the values of $1.2 \times 10^{19}$ cm$^{-3}$ and $1.3 \times 10^{19}$ cm$^{-3}$, respectively. The resistivity of the grown crystal was measured by the eddy current method. The value obtained was 0.015 Ω·cm.

Next, for the purpose of evaluating the basal plane dislocation density present in the grown crystal, a substrate was cut from the grown single crystal ingot at an off-angle of 8° from the (0001) Si plane and polished. The substrate surface was then etched with molten KOH at about 530° C., and the density of the etch pits corresponding to basal plane dislocations were observed with a microscope. The average value obtained for the whole substrate surface was $1.4 \times 10^4$ cm$^{-2}$.

A 51 mm-diameter {0001} single-crystal SiC substrate was further cut from the aforesaid single-crystal SiC and polished into a mirror-finished substrate. The surface orientation of the substrate was given an off-angle of 8° in the [11-20] direction from the (0001) Si plane. Epitaxial growth of SiC was performed using this single-crystal SiC substrate. The SiC epitaxial film growth conditions were: growth temperature of 1550° C. and flow rates of $SiH_4$, $C_2H_4$, $N_2$, and $H_2$ of $5.0 \times 10^{-9}$ m$^3$/sec, $3.8 \times 10^{-9}$ m$^3$/sec, $3.3 \times 10^{-9}$ m$^3$/sec, and $1.7 \times 10^{-5}$ m$^3$/sec, respectively. The growth pressure was 13 kPa. The growth time was 1.2 h, during which the film grew to a thickness of about 8 μm.

Following the epitaxial film growth, the surface morphology of the obtained epitaxial film was examined with a Nomarski light microscope. Surface defects (pits) thought to be caused by dislocation defects were observed in some regions.

Further, a single-crystal SiC substrate was similarly cut from the aforesaid single-crystal SiC to have an off-angle of 0° from the (0001) Si plane and mirror-polished, whereafter a GaN film was epitaxially grown thereon by the MOCVD process. The growth conditions were: growth temperature of 1050° C. and flow rates of TMG, $NH_3$, and $SiH_4$ of $54 \times 10^{-6}$ mol/min, 4 liter/min, and $22 \times 10^{-11}$ mol/min, respectively. The growth pressure was atmospheric pressure. The growth time was 20 min and an n-type GaN film was grown to a thickness of about 1 μm.

In order to check the surface condition of the obtained GaN film, the grown surface was observed with a Nomarski light microscope and was found to exhibit a somewhat rough surface morphology.

Finally, the SiC homoepitaxial wafer prepared earlier was used to test-fabricate SBDs. The materials and sizes of the Schottky electrodes and ohmic contacts were all the same as in Example 1. The breakdown voltages of the 256 SBDs were measured, with an acceptable device being defined as having a device breakdown voltage exceeding 600 V. A device yield of 51% was obtained with the SiC homoepitaxial wafer of this comparative example. The devices that sustained breakdown voltage degradation included many regions where pits and the like were observed on the epitaxial surface. The average ON-state voltage of the SBDs was 1.49 V.

Comparative Example 2

As a comparative example, there will be described a growth experiment in which the concentration difference between the donor-type impurity and the acceptor-type impurity was small. First, the seed crystal 1 was prepared by cutting from an SiC single crystal ingot grown in advance a 50-mm diameter, 1-mm thick substrate with an off-angle of 4° from the {0001} plane. The seed crystal 1 was then used to conduct crystal growth for 50 h by the same procedure as in Example 1. In this comparative example, however, crystal growth was conducted with Ar gas containing 5% nitrogen, in volume by volume percent, passed in as the atmosphere gas. The obtained crystal measured 51.5 mm in diameter and grew to a height of about 33 mm at an average crystal growth velocity of about 0.66 mm/h.

Analysis of the so-obtained SiC single crystal by X-ray diffraction and Raman scattering confirmed growth of a 4H SiC single crystal ingot. Measurement of the nitrogen and boron concentrations of the single-crystal by secondary ion mass spectrometry gave the values of $4.5 \times 10^{18}$ cm$^{-3}$ and $3.8 \times 10^{18}$ cm$^{-3}$, respectively. The resistivity of the grown crystal was measured by the eddy current method. A high resistivity of 0.25 Ω·cm was obtained.

Next, for the purpose of evaluating the basal plane dislocation density present in the grown crystal, a substrate was cut from the grown single crystal ingot at an off-angle of 8° from the (0001) Si plane and polished. The substrate surface was then etched with molten KOH at about 530° C., and the density of the etch pits corresponding to basal plane dislocations were observed with a microscope. The average value obtained for the whole substrate surface was $7.2 \times 10^3$ cm$^{-2}$.

A 51 mm-diameter {0001} single-crystal SiC substrate was further cut from the aforesaid single-crystal SiC and polished into a mirror-finished substrate. The surface orientation of the substrate was given an off-angle of 8° in the [11-20] direction from the (0001) Si plane. Epitaxial growth of SiC was performed using this single-crystal SiC substrate. The SiC epitaxial film growth conditions were: growth temperature of 1550° C. and flow rates of $SiH_4$, $C_2H_4$, $N_2$, and $H_2$ of $5.0 \times 10^{-9}$ m$^3$/sec, $3.8 \times 10^{-9}$ m$^3$/sec, $3.3 \times 10^{-9}$ m$^3$/sec, and $1.7 \times 10^{-5}$ m$^3$/sec, respectively. The growth pressure was 13 kPa. The growth time was 1.2 h, during which the film grew to a thickness of about 8 μm.

Following the epitaxial film growth, the surface morphology of the obtained epitaxial film was examined with a Nomarski light microscope. No surface defects caused by dislocation defects were observed.

Further, a single-crystal SiC substrate was similarly cut from the aforesaid single-crystal SiC to have an off-angle of 0° from the (0001) Si plane and mirror-polished, whereafter a GaN film was epitaxially grown thereon by the MOCVD process. The growth conditions were: growth temperature of 1050° C. and flow rates of TMG, $NH_3$, and $SiH_4$ of $54 \times 10^{-6}$ mol/min, 4 liter/min, and $22 \times 10^{-11}$ mol/min, respectively. The growth pressure was atmospheric pressure. The growth time was 20 min and an n-type GaN film was grown to a thickness of about 1 μm.

In order to check the surface condition of the obtained GaN film, the grown surface was observed with a Nomarski light microscope and was found to exhibit a smooth surface morphology with few pits or the like.

Finally, the SiC homoepitaxial wafer prepared earlier was used to test-fabricate SBDs. The materials and sizes of the Schottky electrodes and ohmic contacts were all the same as in Example 1. The breakdown voltages of the 256 SBDs were measured, with an acceptable device being defined as having a device breakdown voltage exceeding 600 V. Although a device yield of 82% was obtained with the SiC homoepitaxial wafer of this comparative example, the SBDs had an average ON-state voltage of 2.45 V, about 1 V higher than that of those fabricated in Example 1, and were not suitable for power diodes.

INDUSTRIAL APPLICABILITY

The present invention makes it possible to obtain good-quality single-crystal SiC low in dislocation defects with good reproducibility. Its effect becomes particularly pronounced with increasing ingot diameter. Use of substrates and substrates and epitaxial wafers cut from such single-crystal SiC enables fabrication of high-frequency, high-breakdown-voltage electronic devices excellent in electrical properties and blue light-emitting devices excellent in optical properties.

The invention claimed is:

1. A single-crystal silicon carbide ingot comprising single-crystal silicon carbide which contains donor-type impurity at a concentration of $2\times10^{18}$ cm$^{-3}$ to $6\times10^{20}$ cm$^{-3}$ and acceptor-type impurity at a concentration of $1\times10^{18}$ cm$^{-3}$ to $1.5\times10^{19}$ cm$^{-3}$ and wherein the concentration of the donor-type impurity is greater than the concentration of the acceptor-type impurity and the difference is $1\times10^{18}$ cm$^{-3}$ to $5.99\times10^{20}$ cm$^{-3}$, said single-crystal silicon carbide ingot characterized in that the etch pit density caused by basal plane dislocations measured on a single-crystal silicon carbide substrate cut from the ingot at an off-angle of 8° from the (0001) Si plane and polished is $1\times10^{4}$ cm$^{-2}$ or less.

2. A single-crystal silicon carbide ingot according to claim 1, wherein the difference between the donor-type impurity concentration and the acceptor-type impurity concentration is $6\times10^{18}$ cm$^{-3}$ to $5.99\times10^{20}$ cm$^{-3}$.

3. A single-crystal silicon carbide ingot according to claim 1, wherein the crystal polytype of the single-crystal silicon carbide is 4H.

4. A single-crystal silicon carbide ingot according to claim 1, wherein the donor-type impurity is nitrogen.

5. A single-crystal silicon carbide ingot according to claim 1, wherein the acceptor-type impurity is boron.

6. A single-crystal silicon carbide ingot according to claim 1, wherein the acceptor-type impurity is aluminum.

7. A single-crystal silicon carbide ingot according to claim 1, wherein the diameter of the ingot is 50 mm to 300 mm.

8. A single-crystal silicon carbide ingot according to claim 1, wherein the etch pit density caused by basal plane dislocations measured on a single-crystal silicon carbide substrate cut from the ingot at an off-angle of 8° from the (0001) Si plane and polished is $5\times10^{3}$ cm$^{-2}$ less.

9. A single-crystal silicon carbide substrate cut from a single-crystal silicon carbide ingot according to any of claims 1 to 7 and polished.

10. A silicon carbide epitaxial wafer obtained by epitaxially growing a silicon carbide film on the single-crystal silicon carbide substrate of claim 9.

11. A silicon carbide epitaxial wafer obtained by epitaxially growing gallium nitride, aluminum nitride, indium nitride or a mixed crystal thereof on the single-crystal silicon carbide substrate of claim 9.

* * * * *